(12) United States Patent
Chen et al.

(10) Patent No.: US 10,872,870 B2
(45) Date of Patent: Dec. 22, 2020

(54) FABRICATION METHOD OF SEMICONDUCTOR STRUCTURE

(71) Applicant: Siliconware Precision Industries Co., Ltd., Taichung (TW)

(72) Inventors: Yi-Cheih Chen, Taichung (TW);
Sung-Huan Sun, Taichung (TW);
Cheng-An Chang, Taichung (TW);
Chien-Hung Wu, Taichung (TW);
Fu-Tang Huang, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 16/403,877

(22) Filed: May 6, 2019

(65) Prior Publication Data

US 2019/0259723 A1    Aug. 22, 2019

Related U.S. Application Data

(62) Division of application No. 15/645,560, filed on Jul. 10, 2017, now Pat. No. 10,325,872, which is a
(Continued)

(30) Foreign Application Priority Data

Dec. 31, 2014  (TW) .............................. 103146514 A

(51) Int. Cl.
*H01L 21/44* (2006.01)
*H01L 23/00* (2006.01)

(52) U.S. Cl.
CPC .............. *H01L 24/13* (2013.01); *H01L 24/03* (2013.01); *H01L 24/05* (2013.01); *H01L 24/11* (2013.01); *H01L 2224/0231* (2013.01); *H01L 2224/02166* (2013.01); *H01L 2224/03019* (2013.01); *H01L 2224/0345* (2013.01); *H01L 2224/0361* (2013.01); *H01L 2224/03912* (2013.01); *H01L 2224/03916* (2013.01); *H01L 2224/0401* (2013.01); *H01L 2224/05024* (2013.01); *H01L 2224/05166* (2013.01); *H01L 2224/05647* (2013.01); *H01L 2224/10126* (2013.01); *H01L 2224/119* (2013.01);
(Continued)

(58) Field of Classification Search
CPC ......... H01L 24/03; H01L 24/05; H01L 24/11; H01L 24/13
USPC .......................................................... 438/666
See application file for complete search history.

(56) References Cited

U.S. PATENT DOCUMENTS

| | | | |
|---|---|---|---|
| 6,878,633 B2 | 4/2005 | Raskin et al. | |
| 7,312,535 B2 * | 12/2007 | Takewaki | H01L 24/13 257/786 |
| 7,355,279 B2 * | 4/2008 | Ke | H01L 24/11 257/737 |
| 7,446,414 B2 | 11/2008 | Watanabe | |

(Continued)

*Primary Examiner* — Luan C Thai
(74) *Attorney, Agent, or Firm* — Mintz Levin Cohn Ferris Glovsky and Popeo, P.C.; Peter F. Corless; Steven M. Jensen

(57) ABSTRACT

The present invention provides a semiconductor structure and a method of fabricating the same. The method includes: providing a chip having conductive pads, forming a metal layer on the conductive pads, forming a passivation layer on a portion of the metal layer, and forming conductive pillars on the metal layer. Since the metal layer is protected by the passivation layer, the undercut problem is solved, the supporting strength of the conductive pillars is increased, and the product reliability is improved.

11 Claims, 7 Drawing Sheets

Related U.S. Application Data division of application No. 14/957,027, filed on Dec. 2, 2015, now Pat. No. 9,735,124.

(52) U.S. Cl.
CPC ............ *H01L 2224/1147* (2013.01); *H01L 2224/1148* (2013.01); *H01L 2224/11462* (2013.01); *H01L 2224/11474* (2013.01); *H01L 2224/11849* (2013.01); *H01L 2224/11916* (2013.01); *H01L 2224/131* (2013.01); *H01L 2224/13007* (2013.01); *H01L 2224/13024* (2013.01); *H01L 2224/13083* (2013.01); *H01L 2224/13147* (2013.01); *H01L 2224/13155* (2013.01)

(56) References Cited

U.S. PATENT DOCUMENTS

| | | | |
|---|---|---|---|
| 7,847,407 B2 | 12/2010 | Watanabe | |
| 7,960,270 B2* | 6/2011 | Lee | H01L 25/50 438/612 |
| 8,232,193 B2 | 7/2012 | Chang | |
| 8,283,781 B2 | 10/2012 | Wu et al. | |
| 8,592,977 B2* | 11/2013 | Chou | H01L 24/03 257/751 |
| 9,048,149 B2* | 6/2015 | Lai | H01L 24/05 |
| 9,137,886 B2 | 9/2015 | Lee et al. | |
| 9,159,686 B2* | 10/2015 | Chen | H01L 24/13 |
| 9,281,234 B2* | 3/2016 | Chen | H01L 21/76802 |
| 9,673,125 B2* | 6/2017 | Liu | H01L 23/293 |
| 9,761,549 B2* | 9/2017 | Lin | H01L 24/11 |
| 2008/0054461 A1 | 3/2008 | Lang et al. | |

* cited by examiner

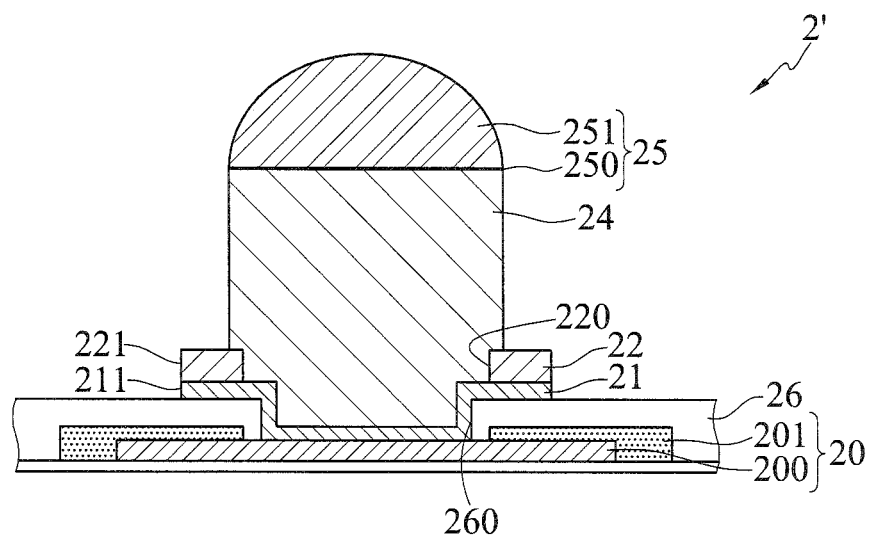
FIG.2G'
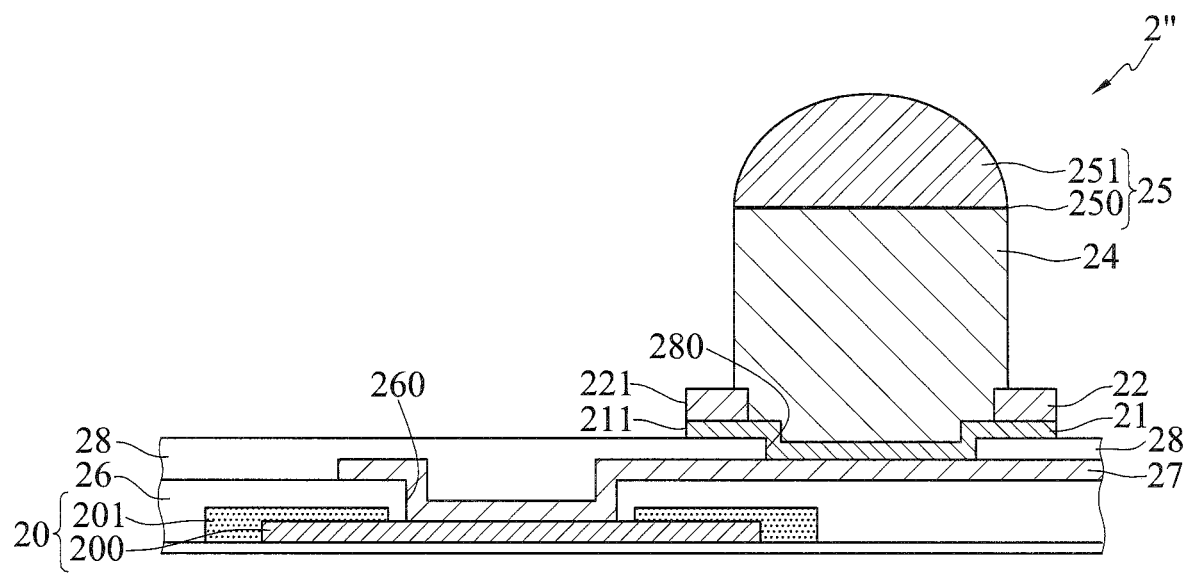
FIG.2G"

FABRICATION METHOD OF SEMICONDUCTOR STRUCTURE

CROSS-REFERENCE TO RELATED APPLICATIONS

This application is a divisional of application U.S. Ser. No. 15/645,560, filed on Jul. 10, 2017, which is a divisional of U.S. Ser. No. 14/957,027, filed on Dec. 2, 2015, now U.S. Pat. No. 9,735,124, which claims under 35 U.S.C. § 119(a) the benefit of Taiwanese Patent Application No. 103146514, filed on Dec. 31, 2014, the entire contents of which are incorporated herein by reference.

BACKGROUND OF THE INVENTION

1. Field of the Invention

The invention relates to semiconductor structures, and, more particularly, to a semiconductor structure having conductive pillars.

2. Description of Related Art

Currently, semiconductor packages contain a wire-bonding package, a flip-chip package, etc. Compared to the wire-bonding package, the flip-chip package is better to reduce the overall volume of semiconductor devices.

A general flip-chip package acts as a semiconductor-chip surface by conductive bumps electrically bonded to conductive pads of the package substrate, and then fills in the primer between the role surface of the semiconductor chip and the package substrate, in order to cover the conductive bump. And, in order to increase the accuracy of counterpoint of the flip chip, the material of the conductive bump is very important.

Conventional semiconductor chips provide for a technology by use of copper pillars for combination, referring to FIGS. 1A to 1D.

As shown in FIG. 1A, a chip 10 having conductive pads 100 is provided. FIG. 1A shows only one conductive pad for description. The outer surface is constituted by silicon-nitride (SiN) layer 101, which exposes the conductive pads 100 through the opening of the SiN layer 101. Then, a dielectric layer 12 is formed on the silicon-nitride layer 101 and on the wall surface of the opening. A titanium (Ti) layer 11 is formed on all the surfaces of the dielectric layer 12 and on the conductive pads 100. A copper (Cu) layer 13 is formed on all the surfaces of the titanium layer 11.

As shown in FIG. 1B, a resist layer 14 is formed on the copper layer 13, and an opening area 140 is formed on the resist layer 14, in order to expose a portion of the copper layer 13. Copper pillars 15 are formed on the copper layer 13 within the opening area 140. A solder material 16 is formed on a top surface of the copper pillars 15.

As shown in FIG. 1C, the resist layer 14 is removed, in order to expose the copper layer 13.

As shown in FIG. 1D, the copper pillars 15 function as stopper portions in order to remove the exposed copper layer 13 and the underneath titanium layer 11 by etching. In the follow-up fabrication process, the solder bump can be formed on the copper pillars 15 and solder material 16 in order for butt joint to the package substrate (not shown). Then a reflow process is performed in order to form the conductive bump which is for immobilization and for electrical connection between the chip 10 and the package substrate.

When the reflow process is performed, the copper pillars 15 would not deform so they can avoid melt and collapse. The copper pillars 15 can prevent traditional chips 10 from deviating. Thus, the copper pillars 15 in the conductive bump can increase the accuracy of counterpoint of the flip chip.

However in the method of fabricating the semiconductor structure, the incident of inward etching would occur because there is isotropy if using etching liquid to etch. So when the exposed copper layer 13 and the underneath titanium layer 11 are removed by etching, the titanium layer 11 would lead to the problem of overlarge undercut (as shown in the undercut area K of FIG. 1D). It results in non-enough support of the copper pillars 15 and results in decreased product reliability because of the bad conductive bump.

Hence, the problem of overlarge undercut which decreases product reliability in prior art is indeed a target to be solved.

SUMMARY OF THE INVENTION

To override various deficiencies of the traditional technology, the invention herein provides a method of fabricating a semiconductor structure, comprising: providing a chip having a plurality of conductive pads and a protective layer that has a plurality of protective-layer openings, with a portion of each of the conductive pads exposed from each of the protective-layer openings; forming a metal layer on the protective layer, and electrically connecting the metal layer to the conductive pads; forming on a portion of the metal layer a first passivation layer that has a plurality of first openings, with a portion of the metal layer exposed from the first openings; forming a plurality of conductive pillars on the exposed portion of the metal layer in the first openings; and removing a portion of the metal layer, with a portion of the metal layer under the conductive pillars and the first passivation layer remained.

This invention further provides a method of fabricating a semiconductor structure, comprising: providing a chip having a plurality of conductive pads and a protective layer that has a plurality of protective-layer openings, with a portion of each of the conductive pads exposed from each of the protective-layer openings; forming a metal layer on the protective layer, and electrically connecting the metal layer to the conductive pads, with a portion of the protective layer exposed from the metal layer; forming on a portion of the metal layer and on the protective layer a first passivation layer that covers a lateral side of the metal layer, and forming a plurality of first openings in the first passivation layer, with a portion of the metal layer exposed from the first openings; and forming a plurality of conductive pillars on the exposed portion of the metal layer in the first openings.

This invention also provides a semiconductor structure, comprising: a chip having a plurality of conductive pads and a protective layer that has protective-layer openings, with each of the conductive pads exposed from each of the protective-layer openings; a metal layer formed on the protective layer and electrically connected to the conductive pads; a first passivation layer formed on the metal layer and having a plurality of first openings, with a portion of the metal layer exposed from the first openings; and a plurality of conductive pillars formed on the exposed portion of the metal layer in the first openings and electrically connected to the metal layer.

From above, this invention "semiconductor structure and fabrication method thereof" provides for the efficacy as follows. The metal layer in contact with the under portion of conductive pillars is protected by the passivation layer. So the metal layer can avoid the problem of overlarge undercut when the follow-up fabrication (e.g. etching) is processed, in order to provide for enough support of the conductive pillars. After formation of the conductive bump used for immobilization and electrical connection between the semiconductor structure and the package substrate, the product reliability can be increased because the conductive bump is good.

DETAILED DESCRIPTION OF THE PREFERRED EMBODIMENTS

By the following specific examples illustrating specific embodiments of the present invention, people familiar with this skill revealed by the contents of this specification can easily understand other advantages and effectiveness of the present invention.

For notice in this specification, the structures depicted in the accompanying drawings, scale, size, etc., are revealed only to match the content of the instructions for the readers to become familiar with the skills. The structures are not intended to limit the implementation and qualification of this invention. The adjustment, not technically meaningful, of any structural modification or the size ratio without affecting the efficacy of the present invention can be generated and achieve the purpose. The adjustment and modification of these should still fall within this technical content of the disclosed invention and can be obtained within the scope of coverage. At the same time, such terms as "on", "top", "lateral side", "the first", "the second" and "the third" this specification refers to are also for the apparent ease of description only. These are not to limit the scope of the present invention and so may be implemented.

FIGS. 2A to 2G are cross-sectional schematic diagrams illustrating a method of fabricating a semiconductor structure of an embodiment according to the present invention.

Figure 1A:
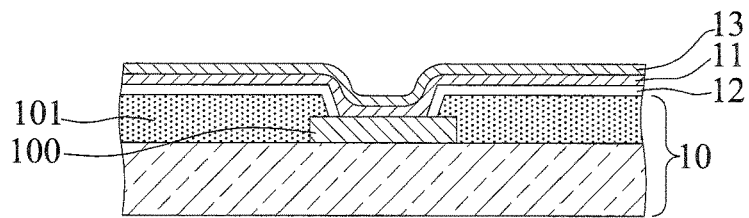
FIGS. 1A to 1D are cross-sectional schematic diagrams illustrating a traditional method of fabricating a semiconductor structure.
Figure 1B:
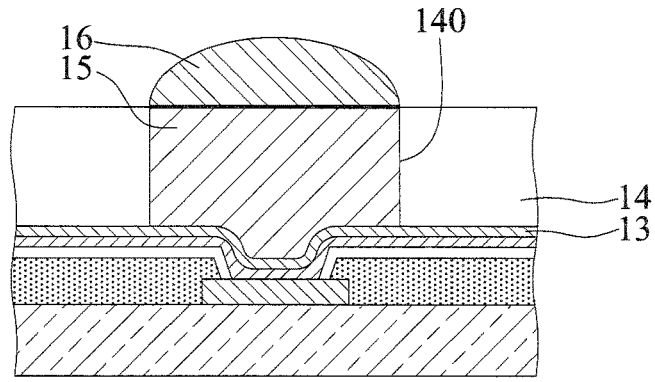
Figure 1C:
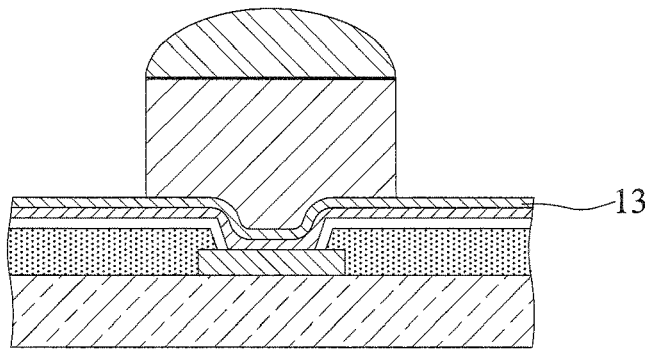
Figure 1D:
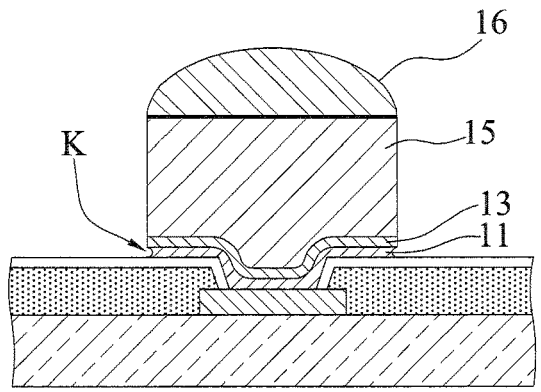
Figure 2A:
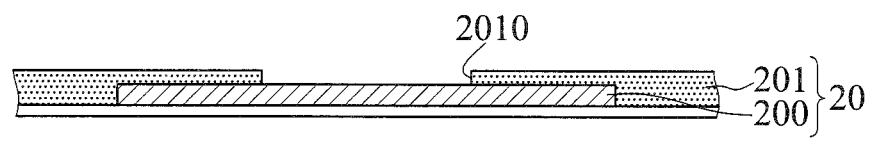
FIGS. 2A to 2G" are cross-sectional schematic diagrams illustrating a method of fabricating a semiconductor structure of an embodiment according to the present invention.

As shown in FIG. 2A, a chip 20 is provided that has conductive pads 200 made of aluminum (Al), for example, and a protective layer 201. In an embodiment, the chip 20 can be one of a plurality of chips of a wafer. In FIG. 1A, the specification is roughly described only by a chip 20 that has a conductive pad 200 and a protective layer 201. The surface of the chip 20 is constituted with such protective layer 201 as Silicon nitride (SiN). The protective layer 201 has a protective-layer opening 2010 to expose a portion of the conductive pad 200. However, there are many types of chip structures known to the industry so they are not necessarily described again.

Figure 2B:
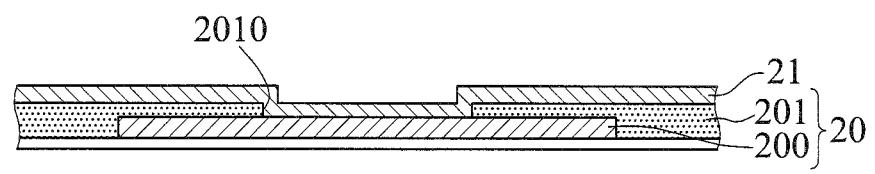

As shown in FIG. 2B, a metal layer 21 made of Titanium and Copper, for example, is formed on the protective layer 201 and on the exposed portion of the conductive pads 200. The metal layer 21 is electrically connected to the conductive pads 200. In an embodiment, the metal layer 21 is formed by sputter.

Figure 2C:
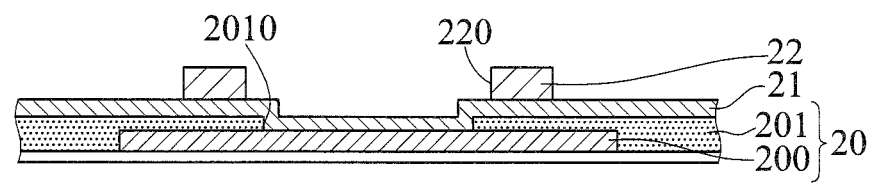

As shown in FIG. 2C, a passivation layer 22 is formed on a portion of the metal layer 21. The passivation layer 22 has a passivation layer opening 220, and a portion of the metal layer 21 is exposed from the passivation layer opening 220. The passivation layer opening 220 is positioned above the protective-layer opening 2010, and has a width greater than or equal to a width of the protective-layer opening 2010.

In an embodiment, in addition to the metal layer 21 within the passivation layer opening 220, the other portion of the metal layer 21 is also exposed from the passivation layer 22. In other words, the passivation layer 22 is only formed on a portion of the metal layer 21, such that the first passivation layer 22 between two neighboring ones of the conductive pads 200 is discontinuous. Preferably, the width of the passivation layer 22 is 5-10 μm.

Figure 2D:
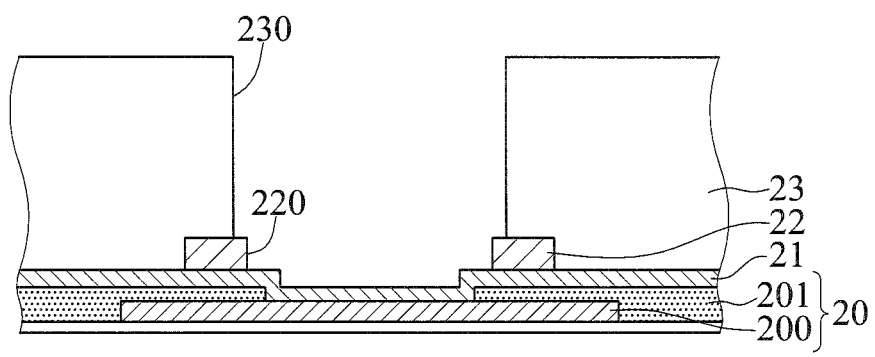

As shown in FIG. 2D, a resist layer 23 such as a photoresistor is formed on the metal layer 21 and on the passivation layer 22. A resist-layer opening 230 is formed by an exposure development process, and a portion of a surface of the metal layer 21 is thus exposed. The resist-layer opening 230 is above the passivation layer opening 220. In an embodiment, the width of the resist-layer opening 230 is greater than or equal to that of the passivation layer opening 220, and a portion of the passivation layer 22 and a portion of the metal layer 21 within the passivation layer opening 220 are exposed.

Figure 2E:
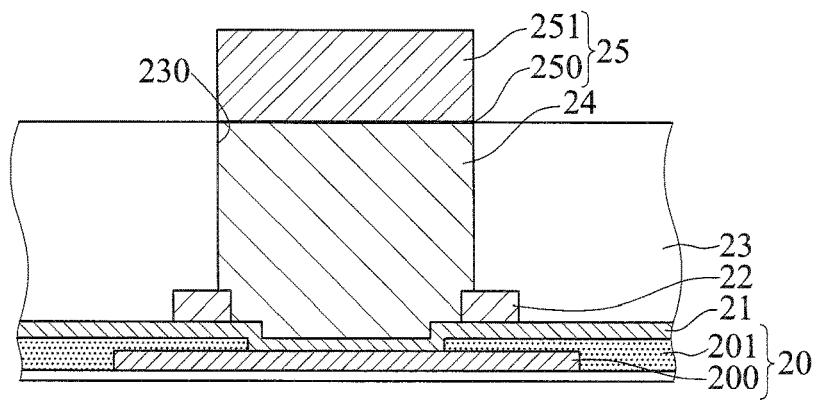

As shown in FIG. 2E, conductive pillars 24 are formed on a portion of the passivation layer 22 within the resist-layer opening 230 and on the metal layer 21 in an electroplating process. In an embodiment, the conductive pillars 24 are copper pillars. Owing to the fact that the width of the resist-layer opening 230 is greater than that of the passivation layer opening 220, a portion of the passivation layer 22 would be embedded into the conductive pillars 24 when the conductive pillars 24 are formed.

In an embodiment, the conductive material 25 can also be formed on the top surface of the conductive pillars 24. In an embodiment, the conductive material 25 can comprise nickel (Ni) material 250 and solder material 251.

Figure 2F:
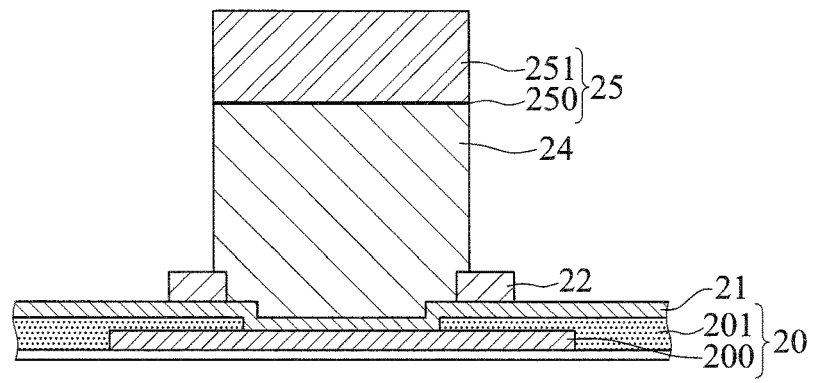

As shown in FIG. 2F, the resist layer 23 is removed, to expose a portion of the metal layer 21 which is not covered by the conductive pillars 24 and the passivation layer 22 as well as to expose a portion of the passivation layer 22 which is not covered by the conductive pillars 24.

Figure 2G:
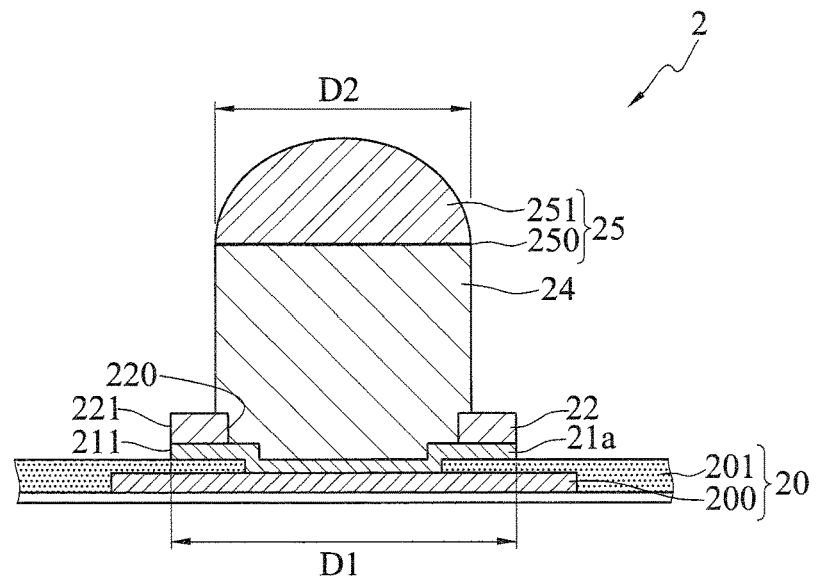

As shown in FIG. 2G, a portion of the metal layer 21 which is not covered by the conductive pillars 24 and the passivation layer 22 is etched and remove, to retain the metal layer 21a below the conduct pillars 24 and the passivation layer 22 as well as to partially expose the protective layer 201 in order to obtain a semiconductor structure 2. In an embodiment, the width D1 of the metal layer 21a which is retained owing to not being etched/removed is greater than the width D2 of the conductive pillars 24. Besides, the lateral side 211 of the non-removed/retained metal layer 21a is flush with the lateral side 221 of the passivation layer 22.

In the follow-up fabrication process, the solder bump can be formed on the conductive pillars 24 and conductive material 25. The solder bump is for butt joint to the package substrate (not shown in the FIG.) and then for proceeding with the fabrication process of the reflow process. These are to form the conductive bump for immobilization and for electrical connection between the semiconductor structure and the package substrate.

In another embodiment, after a chip 20 is provided as shown in FIG. 2A, the passivation layer 26 can be formed on the protective layer 201 and the conductive pads 200, as shown in FIG. 2G'. The passivation layer 26 covers the protective layer 201, and has a passivation layer opening 260 to expose a portion of each of the conductive pads 200. The metal layer 21 is formed by a sputtering process on the passivation layer 26 and on the exposed portion of each of the conductive pads 200 within the passivation layer opening 260. Further fabrication process is the same as shown in FIGS. 2C-2G so it is not necessarily described again.

In another embodiment, after the passivation layer 26 as shown in FIG. 2G' is formed, a re-distribution layer (RDL) 27 is formed on the passivation layer 26 and on the exposed portion of each of the conductive pads 200 within the passivation layer opening 260, as shown in FIG. 2G". Then, the passivation layer 28 is formed on the re-distribution layer 27. The passivation layer 28 has a passivation layer opening 280 to expose a portion of the re-distribution layer 27. Then, the metal layer 21 is formed by a sputtering process on the passivation layer 28 and on the exposed portion of the re-distribution layer 27 within the passivation layer opening 280. Further fabrication process is the same as shown in FIGS. 2C-2G so it is not necessarily described again. In an embodiment, the passivation layer openings 260 and 280 are dislocated mutually in order to achieve the purpose of moving contact location, so that the layout/wiring can be achieved with the method to be more densely packed.

FIGS. 3A-3F are cross-sectional schematic diagrams illustrating a method of fabricating a semiconductor structure of another embodiment according to the present invention. In an embodiment, a portion of fabrication process is the same as those in the embodiment as shown in FIGS. 2A to 2G", so the following only shows the portion of difference without showing the same parts.

Figure 3A:
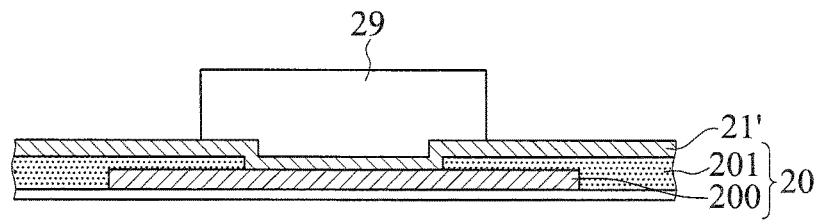
FIGS. 3A to 3F" are cross-sectional schematic diagrams illustrating a method of fabricating a semiconductor structure of another embodiment according to the present invention.

As shown in FIG. 3A, the process follows up the description as shown in FIG. 2A. The metal material 21' is formed on each of the conductive pads 200 of the chip 20 and on the protective layer 201. Then the resist layer 29 is formed on the metal material 21', and a portion of the metal material 21' is exposed. The resist layer 29 is above the metal material 21', and is electrically connected to each of the conductive pads 200.

Figure 3B:
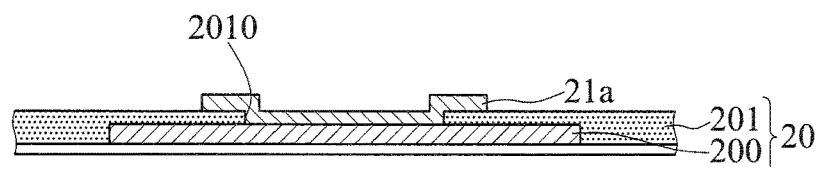

As shown in FIG. 3B, the metal material 21' that is not covered by the resist layer 29, i.e., the exposed portion of the metal material 21', is removed in an etching process. The resist layer 29 is then removed, and the remaining metal material 21' can be as a metal later 21a.

Figure 3C:
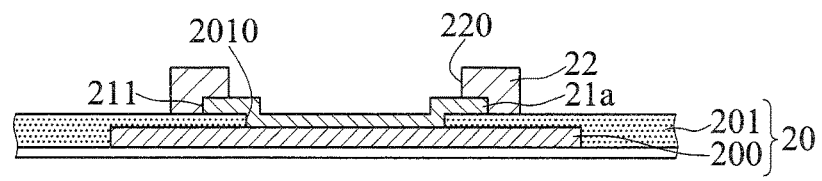
Figure 3C:
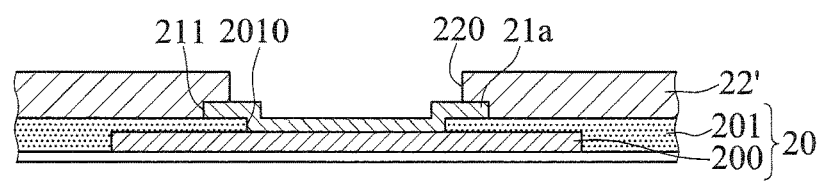

As shown in FIG. 3C, the passivation layer 22 is formed on a portion of the metal layer 21a and on the protective layer 201 of the chip 20. The passivation layer 22 has a passivation layer opening 220, with a portion of the metal layer 21a exposed from the passivation layer opening 220. In an embodiment, the passivation layer 22 covers the lateral side 211 of the metal layer 21a. Preferably, the width of the passivation layer 22 is 5-10 μm.

In an embodiment, in addition to the metal layer 21a within the passivation layer opening 220, the passivation layer 22 also exposes a portion of the protective layer 201. In other words, the passivation layer 22 is formed only on a portion of the metal layer 21a and on the protective layer 201. The passivation layer 22 covers the lateral side 211 of the metal layer 21a in order for the passivation layer 22 between two neighboring ones of the conductive pads 200 to be discontinuous.

In another embodiment, as shown in FIG. 3C', the passivation layer 22' only exposes the metal layer 21a within the passivation layer opening 220. The protective layer 201 is covered by the passivation layer 22', and is thus not exposed. In other words, the passivation layer 22' between two neighboring ones of the conductive pads 200 is continuous.

Figure 3D:
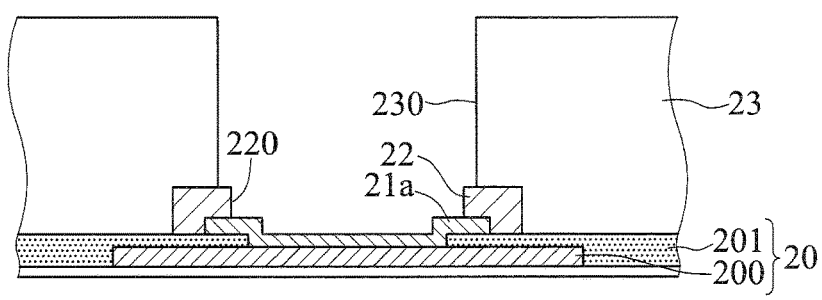

As shown in FIG. 3D, a resist layer 23 is formed as a photoresistor on the protective layer 201 of the chip 20 and on the passivation layer 22. The resist-layer opening 230 is formed in an exposure development process, in order to expose a portion of a surface of the metal layer 21a. The resist-layer opening 230 is above the passivation layer opening 220. In an embodiment, the width of the resist-layer opening 230 is greater than or equal to that of the passivation layer opening 220 in order to expose a portion of the passivation layer 22 and a portion of the metal layer 21a within the passivation layer opening 220.

Figure 3E:
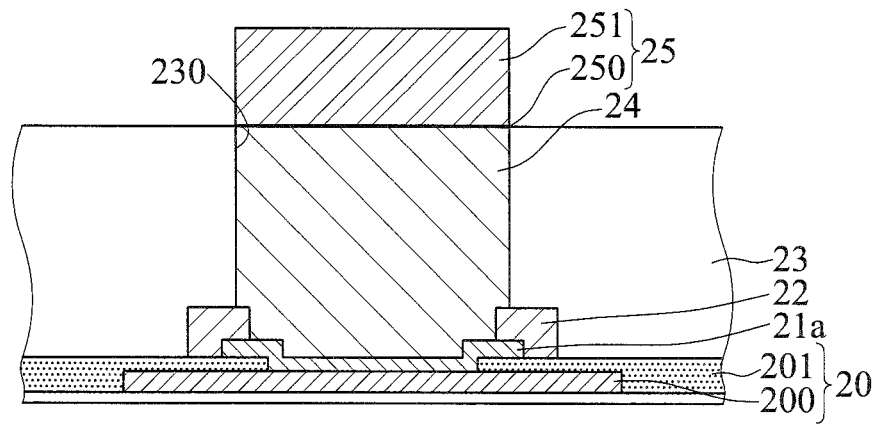

As shown in FIG. 3E, the conductive pillars 24 and the conductive material are formed. The fabrication process is the same as shown in FIG. 2E so it is not necessarily described again.

Figure 3F:
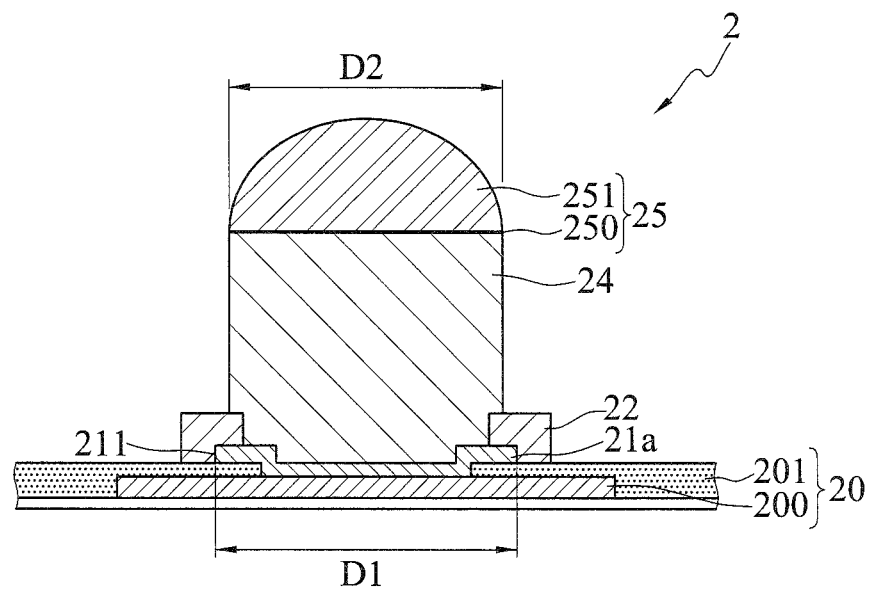
Figure 3F:
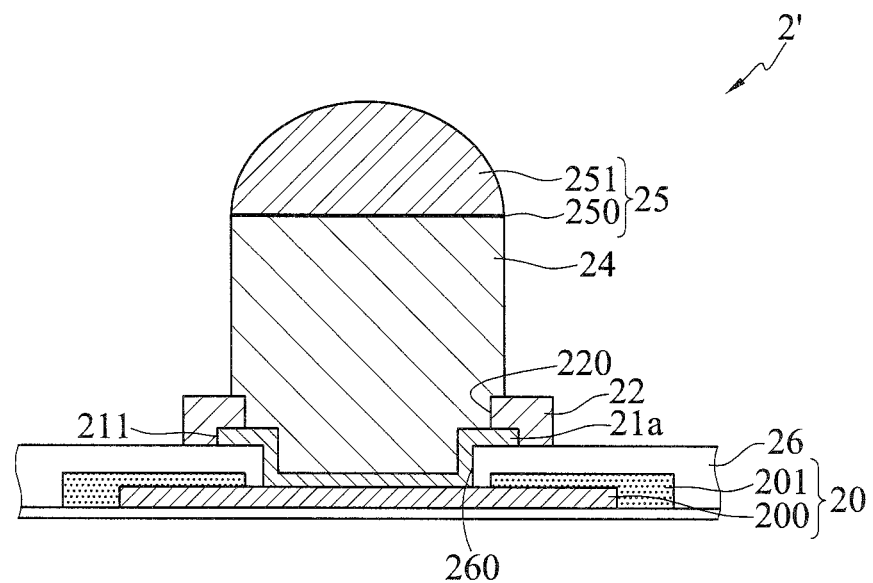
Figure 3F:
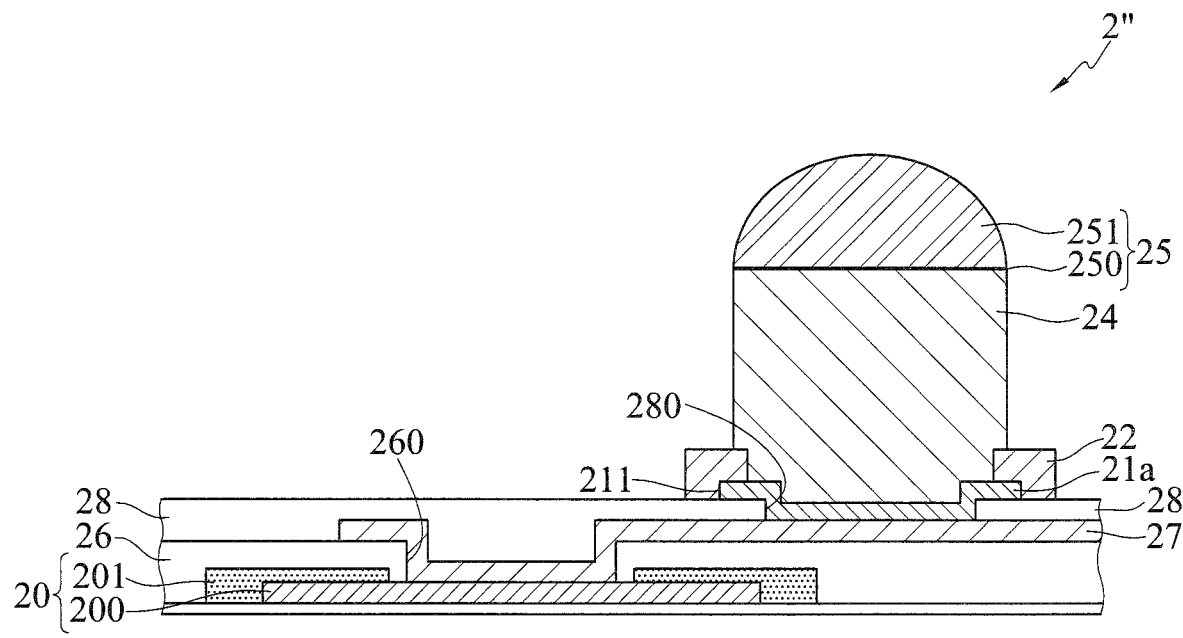

As shown in FIG. 3F, after the resist layer 23 is removed, a semiconductor structure 2 can be obtained, wherein the width D1 of metal layer 21a is greater than or equal to the width D2 of the conductive pillars 24. The difference between this embodiment and prior embodiment is shown as follows. Before the metal layer 21a in this embodiment is in contact with the conductive pillars 24, this embodiment has obtained the desired metal layer 21a through the fabrication process of etching. This embodiment which is different from the prior embodiment is that after the conductive pillars 24 are disposed on the metal layer 21 and the resist layer 23 is removed, the wanted metal layer 21a can be obtained only through the etching fabrication process.

In the other embodiment, after such a chip 20 is provided, as shown in FIG. 2A, the passivation layer 26 can be formed on the protective layer 201 and each of the conductive pads 200, as shown in FIG. 3F'. The passivation layer 26 covers the protective layer 201, and has a passivation layer opening 260 to expose a portion of each of the conductive pads 200. Furthermore, it is then to process the formation of such metal layer 21a as shown in FIG. 3A on the passivation layer 26 and on the exposed portion of each of the conductive pads 200 within the passivation layer opening 260. Further fabrication process is the same as shown in FIGS. 3C-3F so it is not necessarily described again.

In the other embodiment, after the passivation layer 26 as shown in FIG. 3F' is formed, the embodiment can first form the re-distribution layer (RDL) 27 on the passivation layer 26 and on the exposed portion of each of the conductive pads 200 within the passivation layer opening 260, as shown in FIG. 3F". Then, the passivation layer 28 is formed on the re-distribution layer 27. The passivation layer 28 has a passivation layer opening 280 to expose a portion of the re-distribution layer 27. Then, it is to process the formation of such metal layer 21a as shown in FIG. 3A on the passivation layer 28 and on the exposed portion of the re-distribution layer 27 within the passivation layer opening 280. Further fabrication process is the same as shown in FIGS. 3C-3F so it is not necessarily described again. In this embodiment, the passivation layer openings 260 and 280 are dislocated mutually.

This invention further provides a semiconductor structure 2, as shown in FIG. 2G The semiconductor structure 2 further comprises a chip 20, a metal layer 21a, a passivation layer 22 and conductive pillars 24.

The chip 20 has conductive pads 200 made of aluminum materials, and a protective layer 201 made of silicon nitride (SiN). The protective layer 201 has a protective-layer opening 2010 to expose a portion of each of the conductive pads 200.

The metal layer 21a is formed on the protective layer 201 and on the exposed portion of each of the conductive pads 200 in order to electrically connect to each of the conductive pads 200. In an embodiment, the metal layer 21a are made of titanium (Ti) and copper (Cu), for example.

The passivation layer 22 is formed on a portion of the metal layer 21a. The passivation layer 22 has a passivation layer opening 220 in order to expose a portion of the metal layer 21a within the passivation layer opening 220.

The conductive pillars 24 are formed on the exposed portion of the metal layer 21a within the passivation layer opening 220. The conductive pillars 24 electrically connect to the exposed portion of the metal layer 21a within the passivation layer opening 220 of the passivation layer 22. In an embodiment, the conductive pillars 24 are copper pillars. In another embodiment, the width D1 of the metal layer 21a is greater than the width D2 of the conductive pillars 24. The top surface of conductive pillars 24 forms the conductive material 25. The conductive material 25 may comprise nickel (Ni) material 250 and solder material 251. In another embodiment, the conductive material 25 may be the solder material.

In an embodiment, a portion of passivation layer 22 is embedded into the conductive pillars 24. The passivation layer 22 may also be not embedded into the conductive pillars 24, i.e., the width D2 of the conductive pillars 24 being equal to the width of the passivation layer opening 220.

In an embodiment, as shown in FIG. 2G, the lateral side 211 of the metal layer 21a is flush with the lateral side 221 of the passivation layer 22. In another embodiment, as shown in FIG. 3F, the passivation layer 22 covers the lateral side 211 of the metal layer 21a.

This invention further provides a semiconductor structure 2', as shown in FIGS. 2G' and 3F'. The following describes the difference between the semiconductor structure 2' of this embodiment and the semiconductor structure 2. The same portions are not described again.

The semiconductor structure 2' further comprises the passivation layer 26 which is formed on the chip 20, i.e., formed between the protective layer 201 and the metal layer 21. The passivation layer 26 has the passivation layer opening 260 to expose a portion of each of the conductive pads 200 of the chip 20 and covers the protective layer 201 of the chip 20. The metal layer 21 of the semiconductor structure 2' is formed on the passivation layer 26 and on the exposed portion of each of the conductive pads 200 within the passivation layer opening 260.

This invention again provides a semiconductor structure 2", as shown in FIGS. 2G" and 3F". The following only describes the difference between the semiconductor structure 2" of this embodiment and for the semiconductor structure 2'. The same portions are not described again The semiconductor structure 2" further comprises the re-distribution layer 27 and the passivation layer 28. The embodiment forms the re-distribution layer (RDL) 27 on the passivation layer 26 and on the exposed portion of each of the conductive pads 200 within the passivation layer opening 260. The passivation layer 28 is formed on the re-distribution layer 27. The passivation layer 28 has a passivation layer opening 280 to expose a portion of the re-distribution layer 27. In this embodiment, the passivation layer openings 260 and 280 are dislocated mutually.

In summary, this invention provides for the efficacy as follows. The metal layer is in contact with the under portion of conductive pillars is protected by the passivation layer.

So the metal layer can avoid the problem of overlarge undercut when the follow-up fabrication (e.g., etching) is processed, in order to provide for enough support of the conductive pillars. After formation of the conductive bump used for immobilization and electrical connection between the semiconductor structure and the package substrate, the product reliability can be increased because the conductive bump is good.

The embodiments described above are to illustrate and explain the principles and efficacy of the invention by examples, but do not intend to limit the invention. Any person familiar with the art of this can make the modifications to the embodiments described above without violating the spirit and scope of the invention. Therefore, the scope of protection for rights about this invention should be listed in the claims shown as follows.

What is claimed is:

1. A method of fabricating a semiconductor structure, comprising:
   providing a chip having a plurality of conductive pads and at least one insulating layer formed on the plurality of conductive pads, wherein the insulating layer has a plurality of insulating layer openings exposing the plurality of conductive pads;
   forming a metal layer on the insulating layer, and electrically connecting the metal layer to the conductive pads, with a portion of the insulating layer exposed from the metal layer;
   forming directly on a portion of the metal layer and on the insulating layer a passivation layer that covers a lateral side of the metal layer, and forming a plurality of first openings in the passivation layer, with a portion of the metal layer exposed from the first openings, wherein the passivation layer between two neighboring ones of the conductive pads is either continuous or discontinuous, wherein each of the first openings has a width greater than a width of each of the insulating layer openings; and
   after forming the passivation layer on the portion of the metal layer and on the insulating layer, forming a plurality of conductive pillars on the exposed portion of the metal layer in the first openings.

2. The method of claim 1, wherein the metal layer is formed by:
   forming a metal material on the conductive pads and the insulating layer;
   forming a resist layer on the metal material, with a portion of the metal material exposed therefrom;
   removing the exposed portion of the metal material, so as for a remaining portion of the metal material to form the metal layer; and
   removing the resist layer.

3. The method of claim 1, wherein the metal layer is made of titanium and copper.

4. The method of claim 1, wherein the conductive pillars are copper pillars.

5. The method of claim 1, further comprising forming a conductive material on a top surface of each of the conductive pillars.

6. The method of claim 1, wherein the metal layer under each of the conductive pillars has a width greater than or equal to a width of each of the conductive pillars.

7. The method of claim 1, further comprising, after providing the chip having the plurality of conductive pads, forming the insulating layer on the conductive pads, forming a plurality of second openings in the insulating layer, with a portion of each of the conductive pads exposed from each of the second openings, and electrically connecting the metal layer to the conductive pads.

8. The method of claim 1, further comprising, after providing the chip having the plurality of conductive pads, forming the insulating layer on the conductive pads, forming a re-distribution layer on the insulating layer, electrically connecting the re-distribution layer to the conductive pads, and forming the metal layer on the re-distribution layer.

9. The method of claim 8, wherein another insulating layer is formed on the re-distribution layer and the insulating layer, the another insulating layer has a plurality of third openings, and a portion of the re-distribution layer is exposed from the third openings.

10. The method of claim 1, wherein a portion of the passivation layer is embedded into the conductive pillars when the conductive pillars are formed.

11. The method of claim 1, wherein the conductive pillars are formed by:
- forming a resist layer on the insulating layer and the passivation layer, and forming a plurality of openings in the resist layer, with a portion of the metal layer exposed from the openings;
- forming the conductive pillars on the exposed portion of the metal layer in the openings of the resist layer; and
- removing the resist layer.

* * * * *